(12) United States Patent
Wasshuber

(10) Patent No.: US 6,458,666 B2
(45) Date of Patent: Oct. 1, 2002

(54) SPOT-IMPLANT METHOD FOR MOS TRANSISTOR APPLICATIONS

(75) Inventor: Christoph Wasshuber, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/873,545

(22) Filed: Jun. 4, 2001

Related U.S. Application Data

(60) Provisional application No. 60/210,726, filed on Jun. 9, 2000.

(51) Int. Cl.[7] ............................................... H01L 21/336
(52) U.S. Cl. ........................ 438/302; 438/525; 438/531
(58) Field of Search ................................. 438/286, 301, 438/302, 306, 525, 527, 531, 555, 556, 944

(56) References Cited

U.S. PATENT DOCUMENTS

| | | | | | |
|---|---|---|---|---|---|
| 4,962,054 | A | * | 10/1990 | Shikata | 438/525 |
| 5,641,711 | A | * | 6/1997 | Cho | 438/624 |
| 5,783,457 | A | * | 7/1998 | Hsu | 438/302 |
| 6,271,095 | B1 | * | 8/2001 | Yu | 438/302 |
| 6,297,104 | B1 | * | 10/2001 | Tyagi et al. | 438/525 |

OTHER PUBLICATIONS

Wolf, "Silicon Processing for the VLSI Era", 1986, vol. 1, pp. 321–323.*

* cited by examiner

*Primary Examiner*—Chandra Chaudhari
(74) *Attorney, Agent, or Firm*—Peter K. McLarty; W. James Brady III; Frederick J. Telecky, Jr.

(57) ABSTRACT

A spot-implant method for MOS transistors. An asymmetric masking film (50) is formed on a semiconductor substrate and on a transistor gate (30) with an opening (45) adjacent to the transistor gate (30). A spot region (70) is formed adjacent to the transistor gate (30) by ion implantation (60).

9 Claims, 2 Drawing Sheets

SPOT-IMPLANT METHOD FOR MOS TRANSISTOR APPLICATIONS

This application claims priority under 35 USC §119(e)(1) of provisional application Serial No. 60/210,726 filed Jun. 9, 2000.

FIELD OF THE INVENTION

The invention is generally related to the field of MOSFET transistor fabrication and more specifically to a novel process for achieving a spot-implant for use in forming the pocket region in a MOSFET transistor without the use of a photo mask.

BACKGROUND OF THE INVENTION

The threshold voltage of a MOSFET transistor is the voltage that must be applied between the gate electrode and the source electrode to switch the transistor on. This threshold voltage is determined by the gate oxide (dielectric) thickness, the transistor gate length, and the doping concentration in the silicon substrate region beneath the transistor gate. Because most integrated circuits have a fixed voltage supply, the control of the threshold voltage to very tight tolerances across the circuit is crucial to ensuring the proper operation of the circuit. As the transistor gate or channel length is reduced below about 0.4 microns the short channel effect begins to dominate the transistor threshold voltage. This short channel effect results in a threshold voltage that decreases with decreasing gate length. In order to compensate for the short channel effect, an additional implant is introduced during the transistor fabrication process to increase the doping concentration in the substrate beneath the edges of the transistor gate. This additional implant is typically known as a pocket or halo implant.

As illustrated in FIG. 1, the pocket implants 31, 32 are performed after the transistor gate 30 and the gate dielectric 20 is formed. The pocket implants 31 and 32 are usually angled implants that result in formation of regions 33 and 34. The pocket implants are angled to ensure that some of the implanted species end up under the transistor gate 30. The only areas of regions 33 and 34 that are effective in reducing the short channel effect are the areas at or under the transistor gate (or gate) 30. In addition to the angled pocket implants described above, zero tilt implants are also used to form pocket regions. In addition to pocket implants, drain and source extension implants are also performed at this time and result in the formation of the doped region 35 shown in FIG. 1. Because both the pocket implants and the drain and source extension implants are blanket implants of opposite dopant types (i.e. n-type and p-type) counter doping effects will make each region less effective. In addition to the silicon substrate 10, the gate 30 is also subjected to both implants. The counter doping effect of the pocket implant in the gate could begin to have a deleterious effect on transistor operation as the size of the transistors is reduced.

To reduce the above described deleterious effects on transistor performance, a method for forming pocket regions of doping next to the edge of the gate without counter doping the drain extension and source extension regions is required. Currently such methods or fabrication process involve the use of photo masks. In such a process, photoresist would be formed and patterned to expose the silicon substrate next to the gate before the pocket implant process. Photolithographic processes however are the most expensive steps in the fabrication of MOSFET transistors and such a process would be prohibitively expensive. In addition, the alignment of a photo mask to a transistor gate on the substrate is very difficult. A low cost method that does not involve the use of a photo mask is required.

SUMMARY OF THE INVENTION

The instant invention describes a method for forming a spot implant region in a semiconductor substrate. An embodiment of the instant invention comprises the steps of: providing a semiconductor substrate with a gate dielectric over said semiconductor substrate and a transistor gate over said gate dielectric; forming a masking film on said semiconductor substrate and said transistor gate with an opening adjacent to said transistor gate; and forming a spot implant region in said silicon substrate adjacent and adjacent to said transistor gate by implanting a first species through said opening in said masking film; the transistor gate comprises polycrystalline silicon; the first species is an element from the group consisting of arsenic, phosphorous, boron, germanium, antimony, carbon, indium, and boron containing compounds and the masking film is silicon nitride.

The main advantage of the instant invention is the formation of a small area (spot) implant without the use of a photo mask. In an embodiment of the instant invention, the small area implant can be used as a pocket region of a MOS transistor. This and other advantages will be apparent to those of ordinary skill in the art having reference to the specification in conjunction with the drawings

Figure 1:
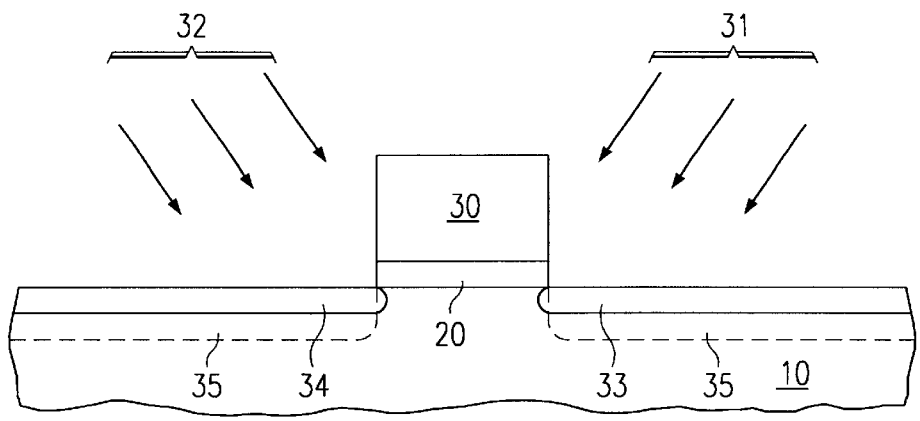
FIG. 1 is a cross-sectional view showing the formation of pocket regions and drain and source extension regions according to the prior art.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 2A–2D, the instant invention can be utilized in any semiconductor device structure. The methodology of the instant invention provides a solution to obtaining a spot implant without the use of a photo mask.

Figure 2A:
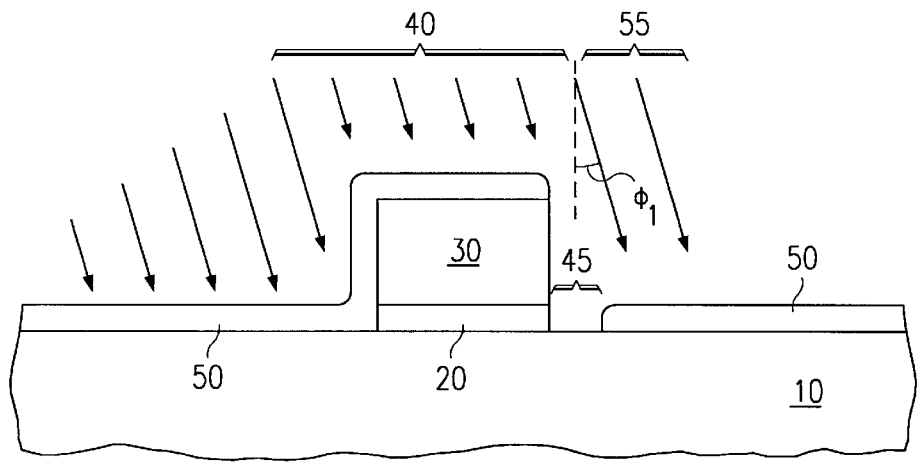
FIGS. 2A–2D are cross-sectional views illustrating an embodiment of the instant invention.

The following description of the instant invention will be related to FIGS. 2A–2D. Referring to FIG. 1A, a semiconductor substrate 10 is provided. A gate dielectric 20 is formed on the surface of the substrate 10. This gate dielectric 20 may be comprised of an oxide, thermally grown SiO2, a nitride, an oxynitride, a silicate, a high-k dielectric, or any combination thereof, and is preferably on the order of 1 to 10 nm thick. A blanket layer of silicon containing material (which will be patterned and etched to form the transistor gate structure) is formed on gate dielectric 20. Preferably, this silicon-containing material is comprised of polycrystalline silicon("poly" or "polysilicon"), but it may be comprised of epitaxial silicon or any other semiconducting material. In forming the gate 30 from the blanket layer of silicon containing material, a layer of photoresist is formed and patterned to define the transistor gate electrode. Next, a polysilicon gate etch process is used to remove portions of the blanket film leaving the polysilicon gate 30 shown in FIG. 2A. This polysilicon gate etch process may comprise a dry anisotropic process. After removal of the patterned photoresist film, the structure is subjected to a asymmetrical deposition process. In this process, a masking film 50 is deposited on the surfaces of the substrate 10 and the gate 30. In an embodiment of the instant invention, the masking film 50 is deposited by exposing the substrate 10 and the gate 30 to a flux of particles 40 at an angle $\phi_1$ 55 as illustrated in FIG. 2A. The particle flux 40 will be shadowed by the gate 30 which will produce an opening 45 in the masking film 50 on the silicon substrate next to the gate 30. In an embodiment of the instant invention, the masking film 50 can comprise silicon nitride, silicon oxide, or any suitable material.

Figure 2B:
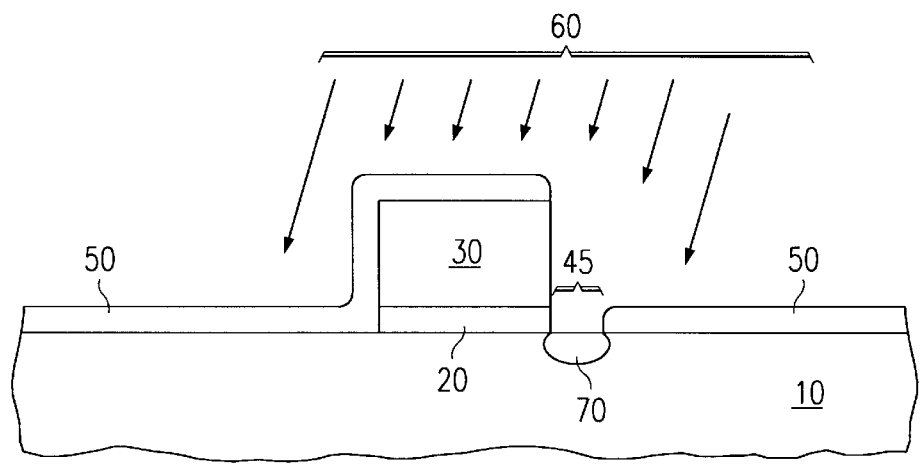
Figure 2C:
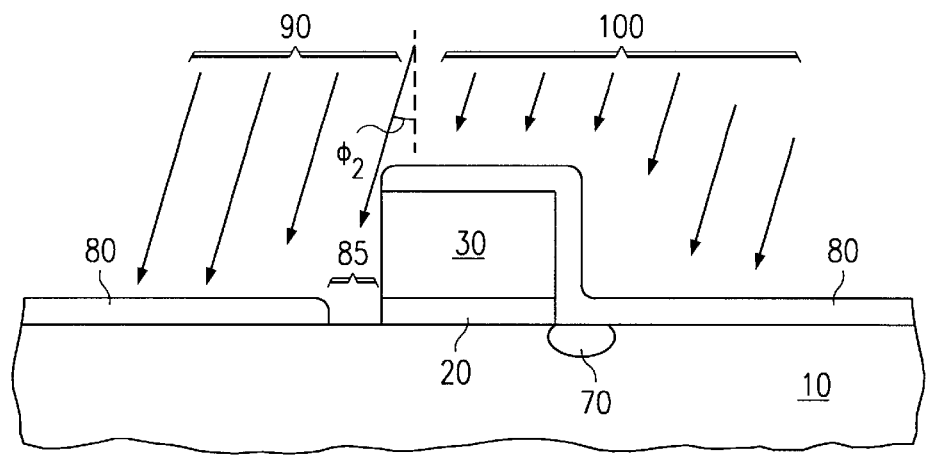
Figure 2D:
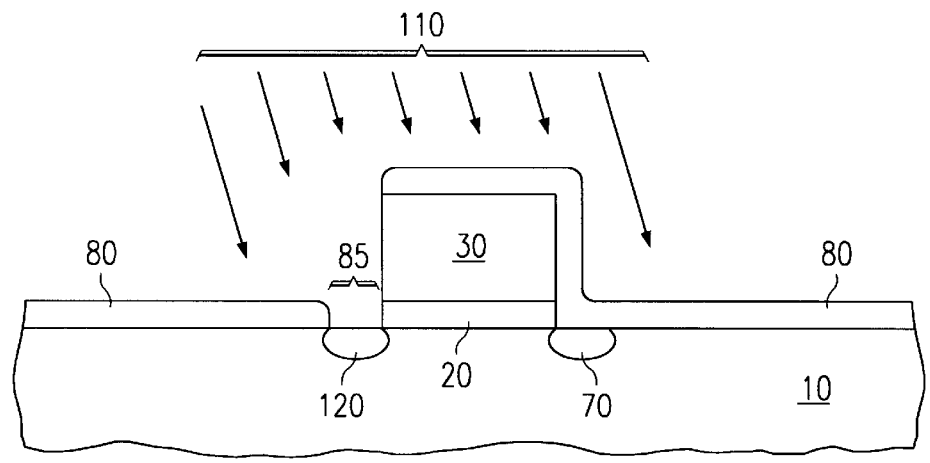

Following the deposition of the masking film 50, an angled pocket implant 60 is performed as shown in FIG. 2B. The pocket region 70 is formed in the substrate through the opening 45 in the masking film 50. The masking film 50 prevents the pocket implant 60 from entering other regions of the substrate 10. Following the formation of the pocket region 70, the masking film 50 is removed and a second masking film 80 is deposited using a second particle flux 100 at a new angle $\phi_2$ 90. The shadowing effect of the gate 30 produces an opening 85 in the second masking film 80. A second pocket implant 110 is performed to produce a second pocket region 120. In general, for a MOSFET transistor pocket regions are required at both the source and drain 25 end of the transistor. After removal of the second masking film 80, the MOSFET transistor can be completed using standard semiconductor processing techniques.

Although the instant invention has been described with respected to the formation of symmetric pocket regions it is not limited to this application. In analog applications, it might be desirable to have a asymmetric transistor and in this case only a single pocket region would be formed. In addition, in certain bipolar/MOSFET applications, the pocket region could be used as the emitter of a bipolar transistor.

Figure 3:
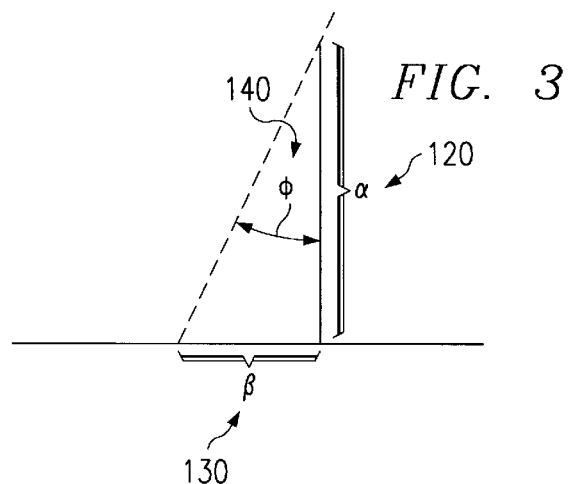
FIG. 3 is a method of determining the incident angle for the particle flux.

In the instant invention, the opening 85 in the masking film 80 will determine the size of the pocket region 120 formed after the pocket implant. It is important therefore to be able to determine the size of the opening formed during the masking film deposition process. One way of determining the size of the opening is illustrated in FIG. 3. In the Figure, the height of the transistor gate is given by α 120 and desired opening is given by β 130. It should be noted that the height of the transistor gate 120 includes that thickness of the gate dielectric film which in most cases will be negligible. In this case the angle φ of the incident particle flux that will be used to form the masking film is given by the relation, $\tan\phi = \beta/\alpha$. Using this relation, the incident angle of the flux of particles can be determined for any combination of transistor gate height 120 and desired opening 130.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A method for forming a pocket region in a MOSFET transistor, comprising:

providing a semiconductor substrate with a gate dielectric over said semiconductor substrate and a transistor gate over said gate dielectric;

forming a masking film on said semiconductor substrate and said transistor gate using an angled flux of particles such that an opening is formed in said masking film adjacent to said transistor gate; and forming a pocket region in said silicon substrate adjacent and under said transistor gate by implanting a first species through said opening in said masking film.

2. The method of claim 1 wherein said first film is polycrystalline silicon.

3. The method of claim 1 wherein said first species is an element from the group consisting of arsenic, phosphorous, boron, germanium, antimony, carbon, indium, and boron containing compounds.

4. The method claim 1 wherein said masking film is silicon nitride.

5. A method for forming a pocket region in a MOSFET transistor, comprising:

providing a semiconductor substrate with a gate dielectric over said semiconductor substrate and a transistor gate over said gate dielectric;

forming a masking film on said semiconductor substrate and said transistor gate using an angled flux of particles with an incident angle p such that an opening is formed in said masking film adjacent to said transistor gate; and forming a pocket region in said silicon substrate adjacent and under said transistor gate by implanting a first species through said opening in said masking film.

6. The method of claim 5 wherein said first film is polycrystalline silicon.

7. The method of claim 5 wherein incident angle is greater that zero degrees and less than ninety degrees.

8. The method of claim 5 wherein said first species is an element from the group consisting of arsenic, phosphorous, boron, germanium, antimony, carbon, indium, and boron containing compounds.

9. The method of claim 5 wherein said masking film is silicon nitride.

* * * * *